United States Patent
Downey et al.

(10) Patent No.: US 6,717,270 B1
(45) Date of Patent: Apr. 6, 2004

(54) INTEGRATED CIRCUIT DIE I/O CELLS

(75) Inventors: Harold A. Downey, Austin, TX (US);
Susan H. Downey, Austin, TX (US);
James W. Miller, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/409,766

(22) Filed: Apr. 9, 2003

(51) Int. Cl.$^7$ .......................... H01L 23/48; H01L 23/52; H01L 29/40
(52) U.S. Cl. .................. 257/758; 257/779; 257/784
(58) Field of Search ........................... 257/758, 779, 257/784

(56) References Cited

U.S. PATENT DOCUMENTS

| | | |
|---|---|---|
| 5,514,892 A | 5/1996 | Countryman et al. |
| 6,008,542 A | 12/1999 | Takamori |
| 6,037,669 A | 3/2000 | Shu et al. |
| 6,121,690 A | 9/2000 | Yamada et al. |
| 6,174,803 B1 * | 1/2001 | Harvey ................ 438/638 |
| 6,242,814 B1 | 6/2001 | Bassett |
| 6,291,898 B1 | 9/2001 | Yeh et al. |
| 6,329,278 B1 | 12/2001 | Low et al. |
| 6,476,506 B1 | 11/2002 | O'Connor et al. |
| 6,489,228 B1 * | 12/2002 | Vigna et al. ............ 438/612 |
| 2003/0218255 * | 11/2003 | Park et al. ............ 257/758 |

FOREIGN PATENT DOCUMENTS

FR   2584259 A1 *   1/1987   ............ H05K/3/46

OTHER PUBLICATIONS

Yong et al., U.S. patent application S/N 10/097,036 entitled "Semiconductor Device Having a Bond Pad and Method Therefor," filed Mar. 13, 2002, Group Art Unit 2811 and assigned to assignee hereof.

Downey et al., U.S. patent application S/N 10/304,416 entitled "Semiconductor Device Having a Bond Pad and Method Therefor," filed Nov. 26, 2002, Group Art Unit 2811 and assigned to assignee hereof.

Downey et al., U.S. patent application S/N 10/097,059 entitled "Semiconductor Device Having a Wire Bond Pad and Method Therefor," filed Mar. 13, 2002, Group Art Unit 2818 and assigned to assignee hereof.

* cited by examiner

*Primary Examiner*—Allan R. Wilson
(74) *Attorney, Agent, or Firm*—David G. Dolezal; Daniel D. Hill

(57) ABSTRACT

An integrated circuit die includes an input/output (I/O) cell. The I/O cell includes active I/O circuitry in a substrate, a plurality of metal interconnect layers, an insulating layer, a first pad, and a second pad. The plurality of metal interconnect layers are formed over the substrate. The insulating layer is formed over the plurality of metal interconnect layers. The second pad is formed over the insulating layer and positioned directly over at least two metal structures in a final metal layer of the plurality of interconnect layers. The pad is selectively coupled to one of at least two metal structures by at least one opening in the insulating layer.

33 Claims, 4 Drawing Sheets

US 6,717,270 B1

INTEGRATED CIRCUIT DIE I/O CELLS

BACKGROUND OF THE INVENTION

1. Field of the Invention

This invention relates in general to integrated circuit (IC) die and specifically to I/O circuitry for IC die.

2. Description of the Related Art

An IC die may include bond pads located on its surface for coupling the circuitry of the IC die to external structures. In one example of a packaged IC, bond pads of an IC die are coupled to bond fingers of a package substrate via bond wires. The bond fingers are coupled to balls located on the packaged IC surface, such as with a ball grid array (BGA) packaged IC.

As integrated circuit technology advances, there is a desire to increase the amount of circuitry in a die, increase the operating speed of the die circuitry, and decrease the size of the die. An increase in the amount of circuitry along with an increase in operating speed may create a push for more bond pads on a die, wherein the decrease in size of the die reduces the amount of space available for these bond pads.

Furthermore, as the amount of circuitry increases and the die size decreases, the process to design an IC die becomes more complicated. In order to increase the efficiency of the IC die design, the circuitry of an IC die may be designed with multiple standardized design blocks of circuitry. For example, an I/O cell of an IC die may be designed from an I/O cell standardized design block.

What is needed is an efficient die design that enables the utilization of standardized design blocks for I/O cell design while increasing the efficiency of the bond pad layout.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
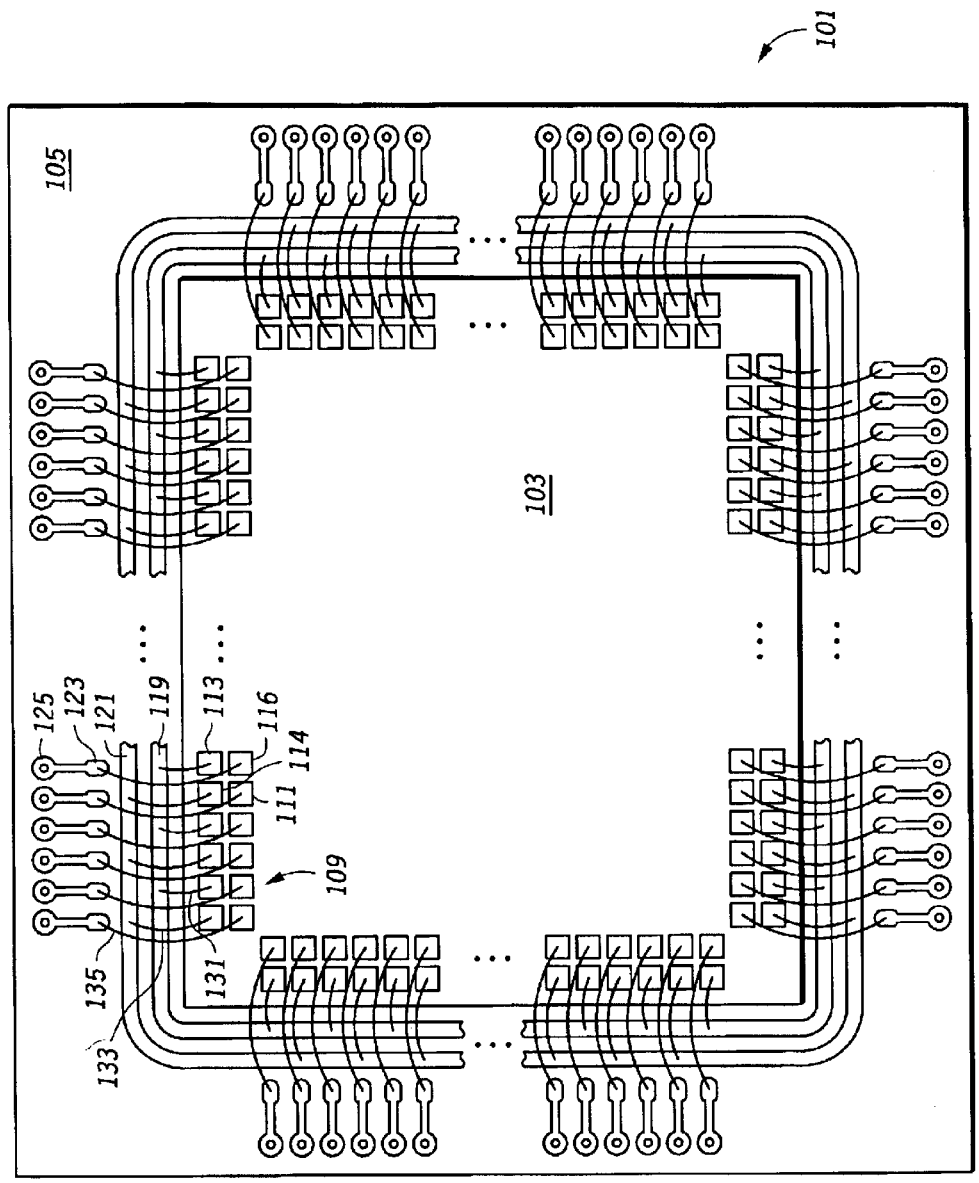
FIG. 1 is a top view of one embodiment of an IC die attached to a package substrate according to the present invention.

FIG. 1 is a top view of one embodiment of a packaged IC 101 including an IC die 103 attached to a package substrate 105 prior to the encapsulation of IC die 103. In the embodiment shown, substrate 105 is a Ball Grid Array (BGA) substrate. However, other types of package substrates may be utilized. Located on the periphery of IC die 103 are bond pads (e.g. 111, 113, 114, and 116) for coupling the circuitry of die 103 (not shown in FIG. 1) to bond fingers (e.g. 123) and power supply rings 119 and 121 located on package substrate 105. In FIG. 1, the bond pads are arranged in an in-line pair configuration. For example, outer pad 114 is located in-line with inner pad 111 to form an in-line pair. Outer pad 114 is located nearer to the edge of IC die 103 than inner pad 111. Each in-line pair is part of an I/O cell. The inner pads (e.g. 111 and 116) of a bond pad pair are signal pads for carrying I/O signals to and/or from die 103. The signal pads are coupled by bond wires (e.g. 135) to bond fingers 123. Bond fingers 123 are connected to conductive vias 125, which are connected to balls (not shown) located on the opposite side of package substrate 105. The balls (not shown) provide external electrical connection for the packaged IC. An I/O cell includes active I/O circuitry (e.g. 211 in FIG. 2) for handling an input signal and/or output signal.

The outer bond pads (e.g. 113 and 114) are power supply pads (e.g. power or ground) for coupling IC die 103 to either a ground ring 119 or a VDD power ring 121 located on package substrate 105. As will be more fully described later, the power supply pads of IC die 103 are each located directly over multiple conductive structures in the final metal interconnect layer (e.g. 316 in FIG. 3) of die 103 and selectively coupled to one of the conductive structures by openings in a passivation layer (e.g. 303 of die 103).

In the embodiment of FIG. 1, because ground ring 119 and power ring 121 are located inside the bond fingers (e.g. 123) of package substrate 105, the power supply pads (e.g. 113 and 114) are placed in the outer pad position of the in-line bond pad pair to facilitate wire bonding. In an alternate embodiment, the power supply pads may be placed in the inner pad position and the signal pads placed in the outer pad position of the in-line bond pad pair.

Ground ring 119 and VDD power ring 121 are coupled to ground balls (not shown) and power balls (not shown), respectively, located on the opposite side (exterior) of substrate 105. Pad 113 is coupled to ground ring 119 and pad 114 is coupled to power ring 121. In some embodiments, ground ring 119 and power ring 121 are each segmented to allow external signal lines (not shown) to pass through the rings on substrate 105. In other embodiments, each segment of a segmented ring may be utilized to provide a different potential to die 103. Other embodiments may include three or more rings with each ring configured to provide a different potential to die 103. In some embodiments, the outer pads may be bonded to bond fingers located on package substrate 105.

In the embodiment of FIG. 1, the outer (power supply) bond pads are configured alternately as power pads and ground pads around the IC die 103 periphery. In an alternate embodiment, the outer bond pads in two neighboring I/O cells may be configured as ground pads, followed by two I/O cells with the outer pads configured as power pads. This pattern may then repeat for every bank of four I/O cells. Other alternate arrangements of ground and power pads may be used in other embodiments. In some embodiments, only a subset of the ground and power pads are wire bonded to conductive structures on the substrate.

Figure 2:
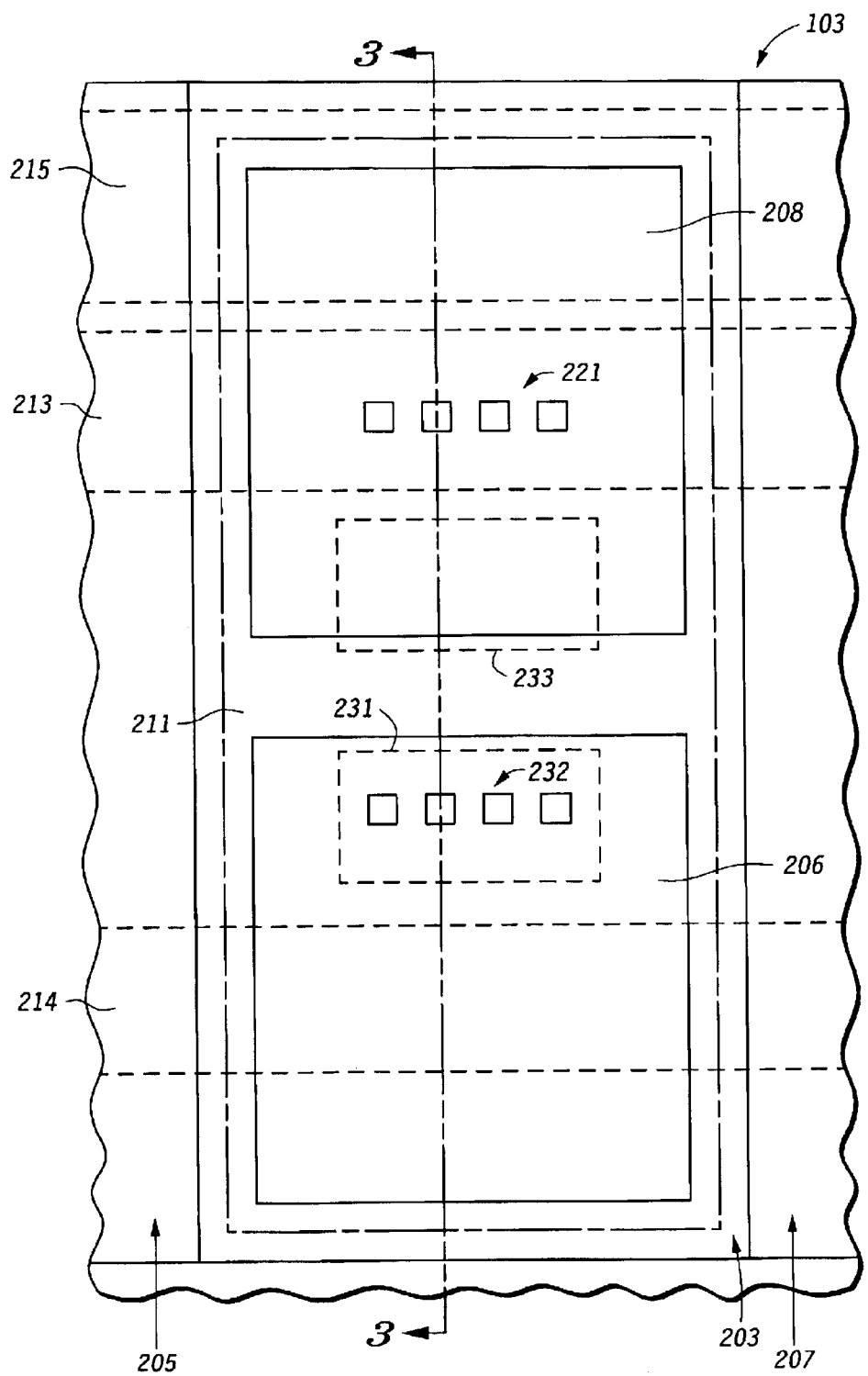
FIG. 2 is partial top view of one embodiment of an IC die according to the present invention.

FIG. 2 is a partial top view of die 103. I/O cell 203 is located on the periphery of die 103 between adjacent I/O cells 205 and 207, located to the left and right of cell 203, relative to the view shown in FIG. 2. In one embodiment, I/O cells 205 and 207 are configured from the same standardized design block as I/O cell 203. I/O cell 203 includes bond pad 208 and bond pad 206 arranged in an in-line configuration.

Bond pad 208 serves as a power supply bond pad coupled either to a power bus or aground bus of die 103. Pad 206 serves as a signal pad. Located beneath the surface of die 103 in the final metal interconnect layer 316 (see FIG. 3) are power supply buses 213, 214, and 215 (shown in dashed lines). Power supply busses 213, 214, and 215 are conductors that, in one embodiment, extend around at least portions of the periphery of die 103 in the interconnect layers to provide power and ground voltages to the I/O cells and active core circuitry (e.g. 520 in FIG. 5) in the substrate of die 103. In one embodiment, the standardized design block includes bus segments for the portions of busses 213, 214, and 215 located in the I/O cell. In some embodiments, the busses may be located in lower metal interconnect layers of die 103.

Figure 3:
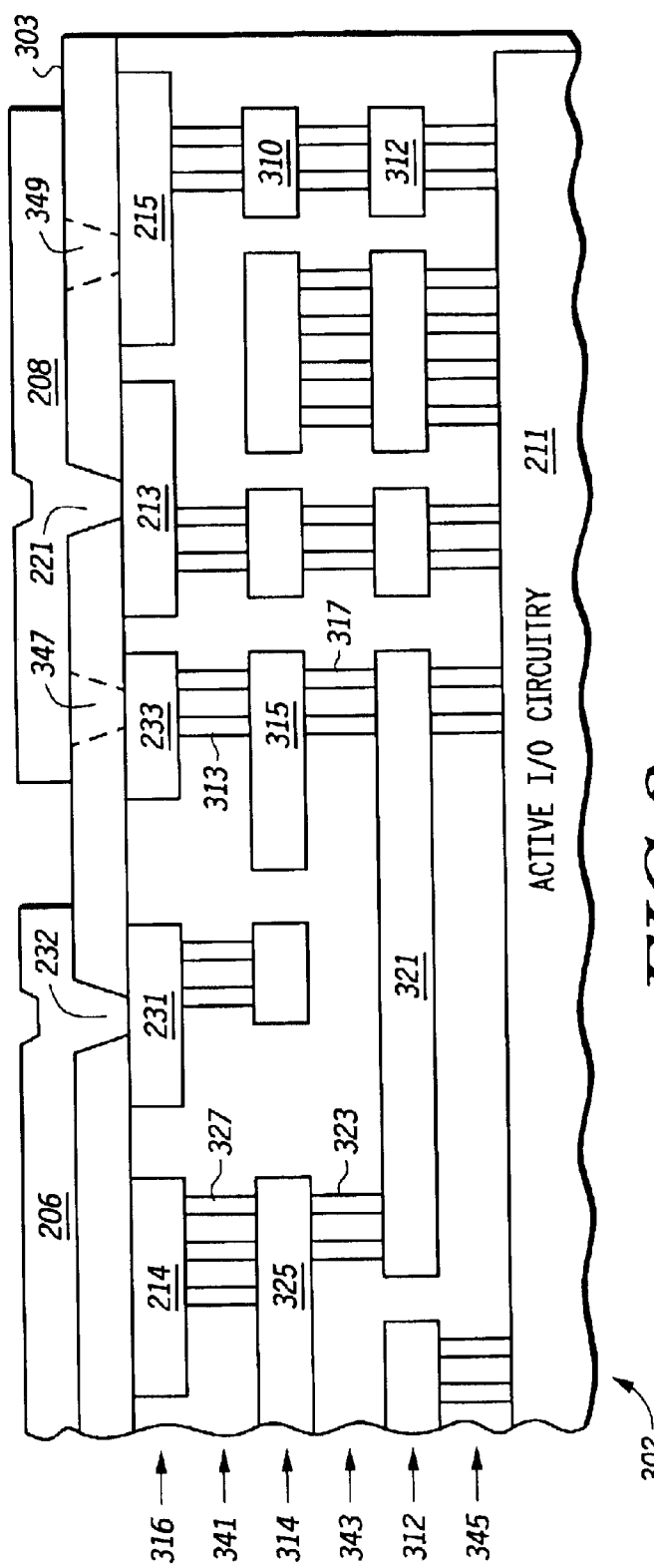
FIG. 3 is a partial cross sectional view of the IC die of FIG. 2 according to the present invention.

In the embodiment shown, pad 208 is coupled to bus 213 by four conformally filled openings at location 221 in the passivation layer (303 in FIG. 3). In one embodiment, openings are 3×3 microns. The size and number of openings may vary with different embodiments. For example, in other embodiments, a pad may be coupled to a structure in the final metal interconnect layer by one opening (e.g. a 10×50 micron opening). Bond pad 206 is coupled to signal conductor 231, which is also located in the final metal interconnect layer, by four conformally filled openings at location 232.

Cell 203 includes active I/O circuitry 211 (shown in dashed lines of intermittent length) located beneath the interconnect layers in the substrate of die. 103. Active I/O circuitry 211 may include output circuitry (e.g. pull-down and pull-up output drivers with associated pre-driver circuitry), input circuitry, electrostatic discharge (ESD) protection circuitry, and self test circuitry (all not shown). In other embodiments, the active I/O circuitry may include other types of conventional I/O circuitry. The active I/O circuitry is associated with signal pad 206.

In one embodiment, the area of I/O cell 203, as shown in FIG. 2, corresponds to the area required to just contain bond pad 206, bond pad 208, the power, ground, and signal conductors, and the active I/O circuitry 211. In the embodiment shown in FIG. 2, I/O cells 203, 205, and 207 abut, but do not overlap. Therefore, in this embodiment, while bond pads 206 and 208 overlie active I/O circuitry 211 of I/O cell 203, they do not overlie any unrelated active I/O circuitry (e.g. active I/O circuitry in I/O cells 205 and 207 or active core circuitry of die 103). In alternate embodiments, portions of pads 206 and 208 may partially overlap unrelated active I/O circuitry. In addition, portions of pad 206 may overlap active core circuitry (e.g. of IC die 103). See, for example, the embodiment of FIG. 5.

In the embodiment of FIG. 2, bond pad 208 is located in-line with pad 206 to form an in-line bond pad pair. In alternate embodiments, pad 208 may be offset relative to pad 206, within I/O cell 203. In FIG. 2, pads 206 and 208 are similar in size. In alternate embodiments, pad 206 and pad 208 may be of different sizes.

FIG. 3 is a partial cutaway view of FIG. 2. Pads 206 and 208 are shown located over a passivation layer 303. In one embodiment passivation layer 303 is an insulating layer that includes silicon nitride. Located below layer 303 are a metal interconnect layer 312, a metal interconnect layer 314, and a final metal interconnect layer 316, which are located between insulating layers 345, 343, and 341, and passivation layer 303. The number of metal interconnect layers may vary in different embodiments. For example, one embodiment of an IC die may include 6 metal interconnect layers.

Power bus 215, ground bus 213, and power bus 214 are located in final metal interconnect layer 316. Also located in final metal interconnect layer 316 are conductors 233 and 231. Conductive structures in each interconnecting layer may be coupled by conductive vias (e.g. 323) extending through an intervening insulating layer (e.g. 343). In some embodiments, insulating layer 303 may include multiple layers of different materials. The metal interconnect layers and insulating layers are located over active I/O circuitry 211 in substrate 302.

Pad 206 is located directly over signal conductor 231 and power bus 214, which are located in final metal interconnect layer 316. Pad 206 is shown coupled to signal conductor 231 by conformally filled openings at location 232. Pad 208 is located directly over bus 215, bus 213, and conductor 233, all three of which are located in final interconnect layer 316. Conductor 233 is coupled to bus 214 by vias 313, conductor 315, vias 317, conductor 321, vias 323, conductor 325, and vias 327. As shown in FIG. 3, pad 208 is selectively coupled to ground bus 213 by openings (e.g. at location 221) in passivation layer 303 located directly over bus 213. With other I/O cells of die 103 designed from the same standardized design block as I/O cell 203, the power supply pad (e.g. 208) may instead be selectively coupled to bus 215 by openings (or a single opening in some embodiments) in passivation layer 303 at location 349 (shown in dashed lines in FIG. 3), or to bus 214 by openings in passivation layer 303 at location 347. In one embodiment, insulating layer 303 is patterned using an insulating layer mask (not shown). Layer 303 is mask programmable for selectively coupling pad 208 to any one of bus 213, bus 215, or conductor 233.

In one embodiment, pads 206 and 208 are formed by the sputter deposition of an aluminum layer over layer 303 and then by the selective etch of the aluminum layer. The sputter deposition of the aluminum conformally fills the openings (e.g. at locations 221 and 232) in passivation layer 303. In one embodiment, the conductive structures (e.g. 213, 315 and 321) in the metal interconnect layers 312, 314, and 316 are made from copper. With some embodiments, a thin conductive barrier layer (e.g. that includes tantalum) may be located between the aluminum in the openings of passivation layer 303 (e.g. at location 221) and the copper of final metal interconnect layer 316 to prevent diffusion and promote adhesion between the two dissimilar and adjacent metals (e.g. the aluminum of pad 208 and the copper of bus 213). In other embodiments, the metal interconnect layers and/or the bond pads may be made of other material such as gold, copper, or aluminum. In other embodiments, other types of conductive vias may be used.

Providing an I/O cell design having a bond pad that can be selectively coupled to a number of conductive structures in a final metal interconnect layer by selectively placing openings in an insulative layer may allow for use of a universal I/O cell design that can be programmed to be coupled to any one of a number of conductive structures. Such an advantage may allow for a decrease in the complexity of an IC die design in that all (or a least a substantial majority) of the I/O cells can be designed using the same standardized I/O cell design block.

Furthermore, utilizing a pad that is selectively couplable to multiple conductive structures in a two pad I/O cell may advantageously provide for a die with greater utilization of die space, thereby allowing for the possibility of more I/O cells per IC die. In some instances, one pad may be coupled to a signal and the second pad may be selectively coupled to either a power or ground conductor, thereby allowing for a single I/O pad cell which incorporates either a power or ground pad to maximize flexibility for power and ground placement in a bank of I/O cells.

In other embodiments, some of the conductive structures in final metal interconnect layer 316 may be coupled to signal lines such that pad 208 may be selectively coupled to one of one or more signal lines. In other embodiments, the number of conductive structures in the final metal interconnect layer that a pad is located directly over may vary. In one embodiment, pad 208 is located directly over a number of conductive structures with each conductive structure coupled to a different power supply potential of an IC die. With such an embodiment, pad 208 may be coupled to any of the power supply potentials being supplied to IC die 103. In one example of such an embodiment, pad 208 may be selectively coupled to a +3.3 V bus, a -3.3 V bus, a +1.8 V bus, or a ground bus.

In other embodiments, each conductive structure located directly under a pad is coupled to provide a different signal. The pad may be selectively coupled to any one of the signals by forming at least one opening in the passivation layer to couple the pad to the selective signal conductor. For example, a pad may be located over two structures where one structure is coupled to provide one of a pair of differential signals and the other structure is coupled to provide the other of the pair of differential signals.

In other embodiments, pad 206 may be located directly over multiple conductive structures wherein pad 206 would be selectively couplable to one of the conductive structures by at least one opening in passivation layer 303. In one embodiment, the conductive structures would be configured to carry signals. In other embodiments, at least one of the conductive structures would be coupled to a power supply conductor.

Figure 4:
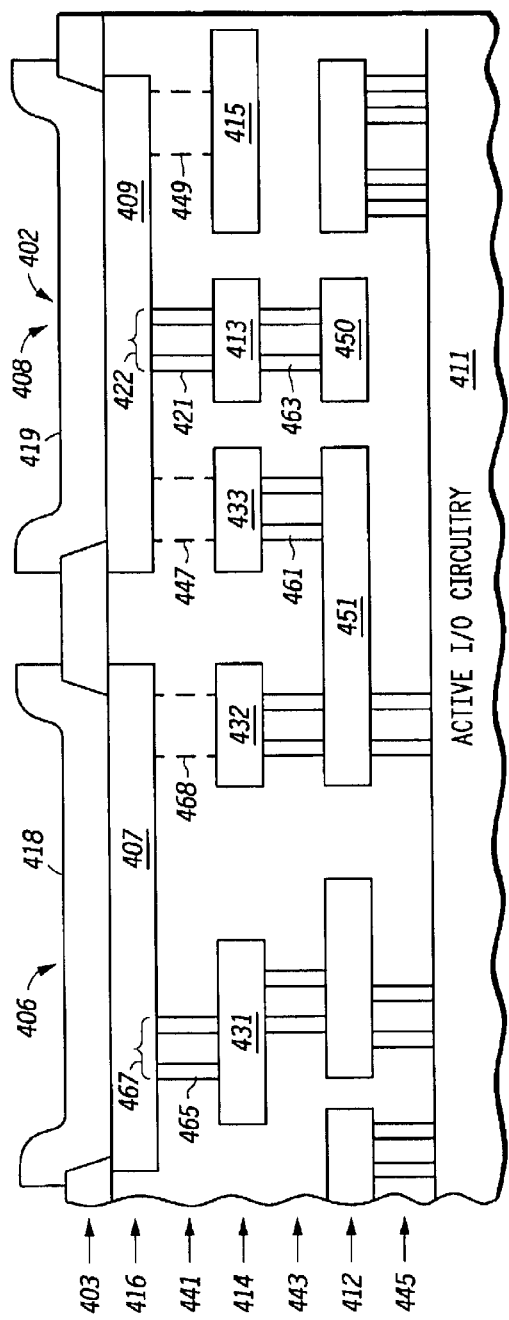
FIG. 4 is a partial cross sectional view of another IC die according to the present invention.

FIG. 4 is a partial cutaway view of another IC die according to the present invention. The bond pads of die 401 include both a portion formed in final metal interconnect layer 416 and an aluminum cap. For example, I/O cell 402 includes pads 406 and 408 having portions 407 and 409, respectively, formed in final metal interconnect layer 416, which in one embodiment is made of copper. Also, bond pads 406 and 408 each include aluminum caps, 418 and 419, respectively, which cover the portion (e.g. 407 and 409) of each pad formed in layer 316 that is exposed by openings in passivation layer 403. Aluminum caps (e.g. 418 and 419) are used to improve wire bond yield and manufacturability. In some embodiments, pads 406 and 408 may include a barrier layer (not shown) between the aluminum of the aluminum caps and the copper of layer 416. However, the bond pads of other IC die according to the present invention may not include such caps.

I/O cell 402 includes active I/O circuitry 411 located below pads 406 and 408. Above active I/O circuitry 411 are a first metal interconnect layer 412, a second metal interconnect layer 414, and a final metal interconnect layer 416. In one embodiment, metal interconnect layers 412, 414, and 416 are formed from copper. In alternate embodiments, the metal interconnect layers may be formed predominantly from aluminum. The three metal interconnect layers are located between insulating layers 445, 443, 441, and passivation layer 403. In some embodiments, insulating layers 445, 443, 441, and passivation layer 403 may include multiple layers of different materials. In one embodiment, passivation layer 403 is an insulating layer that includes silicon nitride.

While three metal interconnect layers are shown in FIG. 4, the number of metal interconnect layers may vary in different embodiments. In the embodiment of FIG. 4, ground bus 413, power bus 415, and signal conductor 433 are located in metal interconnect layer 414. Also located in metal interconnect layer 414 are signal conductor 432 and signal conductor 431. Metal conductors in one interconnect layer may be coupled to metal conductors in another interconnect layer by conductive vias (e.g. 461, 463) extending through an insulating layer (e.g. 443).

Pad 406 is located directly over signal conductor 431 and signal conductor 432, which are located in metal interconnect layer 414. Pad 406 is shown selectively coupled to signal conductor 431 by conductive vias 465 located in openings in insulating layer 441 at location 467. With other I/O cells of die 401 designed from the same standardized design block as I/O cell 402, pad 406 may instead be selectively coupled to power bus 432 by conductive vias in openings of insulating layer 441 at location 468 (shown with dashed lines).

Pad 408 is located directly over portions of power bus 415, ground bus 413, and signal conductor 433, which are located in metal interconnect layer 414. Pad 408 is shown coupled to ground bus 413 by conductive vias 421 located in openings in insulating layer 441 at location 422. With other I/O cells of die 401 designed from the same standardized design block as I/O cell 402, pad 408 may instead be selectively coupled to power bus 415 by conductive vias in openings of insulating layer 441 at location 449 (shown with dashed lines), or selectively coupled to signal conductor 433 by conductive vias in openings of insulating layer 441 at location 447 (shown with dashed lines). Accordingly, bond pad 408 may be selectively coupled to either ground bus 413, power bus 415, or signal conductor 433. Therefore the outer (power supply) bond pad 408 in the standardized I/O cell may be configured to serve to provide a voltage potential, a ground potential, or a signal path to die 401.

Bond pad 408 may be coupled to other conductive structures of the metal interconnect layers 416, 414, and 412. For example, conductor 450, in first metal interconnect layer 412, is shown coupled to pad 408 by way of conductive vias 421, bus 413, and conductive vias 430. In some embodiments, the power and ground busses of an IC die may be located in other metal interconnect layer (e.g. 412).

In the embodiment shown in FIG. 4, conductive vias 421 are shown located directly below the portion of pad portion 408 exposed by the opening in passivation layer 403. In alternate embodiments, these vias may be placed directly below portions of pad portion 408 not exposed by the opening in passivation layer 403.

In the embodiment shown in FIG. 4, the outer (power supply) bond pad 408 may be selectively coupled to ground bus 413, power bus 415, or signal conductor 433, by placement of conductive vias at location 422, 449 or 447, respectively, in insulating layer 441. Since each of these locations are in the same insulating layer 441, during the design and layout the IC die 401, the mask used to pattern layer 441 is programmed to selectively couple outer bond pad 408 to one of bus 413, bus 415 or conductor 433. Accordingly pad 408 may be programmed to be coupled to a power conductor or a signal conductor depending upon the location of the conductive vias beneath it.

Figure 5:
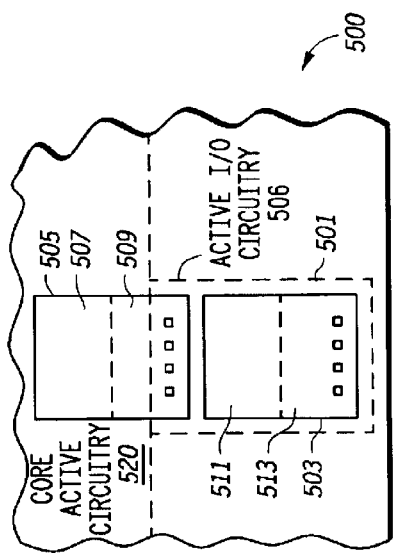
FIG. 5 is a partial top view of another embodiment of an IC die according to the present invention.

FIG. 5 is a partial top view and another embodiment of an IC die according to the present invention. IC die 500 includes an I/O cell 501 located at the periphery of IC die 500. I/O cell 501 includes an outer bond pad 503 and an inner bond pad 505. Bond pad 503 and bond pad 505 each includes a wire bond region (513 and 509, respectively) for bonding a wire to the pad. Bond pad 503 and bond pad 505 each include a probe region (511 and 507, respectively) for receiving a probe for testing purposes. Pads 503 and 505 are located over active I/O circuitry 506 located in the substrate of IC die 500. Pad 505 also extends over the core circuitry 520 located in the substrate of IC die 500.

In other embodiments, a pad that is located directly over multiple conductive structures of a metal interconnect layer and that is selectively couplable to any of those conductive structures may be implemented in a single pad I/O cell or an I/O cell with more than two pads. In other embodiments, such pads may be used in IC die where the pads are staggered.

Also in other embodiments, a pad that is selectively couplable to any one of multiple conductive structures of an interconnect layer located directly below it may be implemented on other types of IC die having other types of configurations including e.g. flip chip IC die. With a flip chip configuration, the pads of an IC die are considered located over the interconnect layers of the IC die even if in the packaged IC, the IC die is oriented with the surface having the pads facing downward and the interconnect layers are oriented in the packaged IC in a position above.

In one aspect of the invention, an integrated circuit (IC) die includes a plurality of input/output (I/O) cells. Each I/O cell of the plurality includes active I/O circuitry located in a substrate of the IC die and a plurality of metal interconnect layers formed over the substrate. The plurality of metal interconnect layers includes a first power supply conductor, a second power supply conductor, and a signal conductor. Each I/O cell also includes an insulating layer formed over the plurality of metal interconnect layers, a first pad formed over the insulating layer and coupled to the signal conductor, and a second pad formed over the insulating layer. The second pad is directly over at least two metal structures in a top metal layer of the plurality of metal interconnect layers. The second pad being selectively coupled to one of the at least two metal structures through at least one opening in the insulating layer.

In another aspect of the invention, an integrated circuit (IC) die includes an input/output (I/O) cell. The I/O cell includes active I/O circuitry located in a substrate of the IC die, a plurality of metal interconnect layers formed over the substrate, and an insulating layer formed over the plurality of metal interconnect layers. The I/O cell also includes a first pad formed over the insulating layer and coupled to a first metal structure of the plurality of metal interconnect layers through at least one opening in the insulating layer and a second pad formed over the insulating layer. The second pad is directly over at least two metal structures in a top metal layer of the plurality of metal interconnect layers. The second pad being selectively coupled to one of the at least two metal structures through at least one opening in the insulating layer directly over the one of the at least two metal structures.

In another aspect of the invention, a method of making an IC die includes providing a standardized design block for an I/O cell of a semiconductor die. The I/O cell includes a metal interconnect layer, an insulating layer formed over the metal interconnect layer, a first pad to convey a signal, and a second pad to convey a power supply potential. The second pad is formed directly over at least two metal structures in the metal interconnect layer. The insulating layer includes a plurality of locations. Each metal structure of the at least two metal structure corresponds to a location of the plurality. A first of the at least two metal structures is a conductor for conveying a first power supply potential and a second of the at least two metal structures is a conductor for conveying a second power supply potential. The method includes programming a mask to selectively couple the second pad to one of the at least two metal structures through at least one opening at a location of the plurality corresponding to the one of the at least two metal structures. The method also includes patterning the insulating layer using the mask.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit (IC) die including a plurality of input/output (I/O) cells, each I/O cell of the plurality comprising:

active I/O circuitry located in a substrate of the IC die;

a plurality of metal interconnect layers formed over the substrate, the plurality of metal interconnect layers including a first power supply conductor, a second power supply conductor, and a signal conductor;

an insulating layer formed over the plurality of metal interconnect layers;

a first pad formed over the insulating layer and coupled to the signal conductor; and a second pad formed over the insulating layer, the second pad directly over at least two metal structures in a top metal layer of the plurality of metal interconnect layers, wherein the second pad being selectively coupled to one of the at least two metal structures through at least one opening in the insulating layer.

2. The IC die of claim 1 wherein the second pad is arranged substantially in-line with the first pad.

3. The IC die of claim 1 wherein a first one of the at least two metal structures is coupled to the first power supply conductor, the first power supply conductor is configured to convey a first power supply potential, and a second one of the at least two metal structures is coupled to the second power supply conductor, the second power supply conductor is configured to convey a second power supply potential.

4. The IC die of claim 3 wherein the second pad is selectively coupled to one of either the first one of the at least two metal structures or the second one of the at least two metal structures through the at least one opening in the insulating layer.

5. The IC die of claim 3 wherein for a first I/O cell of the plurality, the second pad is selectively coupled to the first one of the at least two metal structures and for a second I/O cell of the plurality, the second pad is selectively coupled to the second one the at least two metal structures.

6. The IC die of claim 1, wherein the insulating layer includes a passivation layer.

7. The IC die of claim 1, wherein a first one of the at least two metal structures is a conductor for proving a voltage potential, and a second one of the at least two metal structures is a conductor for providing a ground potential.

8. The IC die of claim 1, wherein the second pad is coupled to the one of the at least two metal structures by conformally filling the at least one opening through the insulating layer with metal of the second pad.

9. The IC die of claim 1, wherein the second pad is coupled to the one of the at least two metal structures by a conductive via in each of the at least one opening through the insulating layer.

10. The IC die of claim 1, wherein the plurality of metal interconnect layers comprise copper and the first and second pads comprise aluminum.

11. The IC die of claim 1, wherein a portion of the first pad extends over active circuitry unrelated to the active I/O circuitry of the I/O cell.

12. The IC die of claim 1, wherein the first and second pads are characterized as being wire bonding pads.

13. The IC die of claim 1, wherein the insulating layer is patterned using an insulating layer mask and is mask programmable for selectively coupling the second pad to one of the at least two metal structures through the at least one opening at a predetermined location in the insulating layer directly over the one of the at least two metal structures.

14. The IC die of claim 1, wherein a metal structure of the at least two metal structures is coupled to a power supply bus not located directly under the second pad.

15. The IC die of claim 1, each I/O cell further comprising:
a final metal interconnect layer formed over the insulating layer, wherein at least a portion of the first pad and at least a portion of the second pad is located in the final metal interconnect layer.

16. The IC die of claim 15 wherein the first pad and the second pad each include an aluminum cap.

17. A packaged IC including the IC die of claim 1.

18. The IC die of claim 1 wherein the second pad is located nearer to a die edge of the IC die than the first pad.

19. An integrated circuit (IC) die including an input/output (I/O) cell, the I/O cell comprising:
active I/O circuitry located in a substrate of the IC die;
a plurality of metal interconnect layers formed over the substrate;
an insulating layer formed over the plurality of metal interconnect layers;
a first pad formed over the insulating layer and coupled to a first metal structure of the plurality of metal interconnect layers through at least one opening in the insulating layer; and
a second pad formed over the insulating layer, the second pad directly over at least two metal structures in a top metal layer of the plurality of metal interconnect layers,
wherein the second pad being selectively coupled to one of the at least two metal structures through at least one opening in the insulating layer directly over the one of the at least two metal structures.

20. The IC die of claim 19, wherein the first metal structure is coupled to the active I/O circuitry and is configured to convey a signal.

21. The IC die of claim 19 wherein a first of the at least two metal structures is for conducting a first power supply potential, and a second of the at least two metal structures is for conducting a second power supply potential.

22. The IC die of claim 21 wherein a first of the at least two metal structures is for conducting a voltage potential, and a second of the at least two metal structures is for conducting a ground potential.

23. The IC die of claim 19, wherein the insulating layer includes a passivation layer.

24. The IC die of claim 19, wherein the first and second pads are characterized as being wire bonding pads.

25. The IC die of claim 19, wherein one or both of the first and second pads include probe regions.

26. The IC die of claim 19, wherein the insulating layer is patterned using an insulating layer mask and is mask programmable for selectively coupling the second pad to one of the at least two metal structures through the at least one opening at a predetermined location in the insulating layer directly over the one of the at least two metal structures.

27. The IC die of claim 19, wherein a portion of the first pad extends over active circuitry unrelated to the active I/O circuitry of the I/O cell.

28. The IC die of claim 19, wherein the first pad and the second pad do not extend over active circuitry unrelated to the active I/O circuitry of the I/O cell.

29. The IC die of claim 19, wherein the first pad and the second pad do not extend over active I/O circuitry of an adjacent I/O cell.

30. The IC die of claim 19, the I/O cell further comprising:
a final metal interconnect layer formed over the insulating layer, wherein at least a portion of the first pad and at least a portion of the second pad is located in the final metal interconnect layer.

31. A packaged IC including the IC die of claim 19.

32. The IC die of claim 19, wherein the at least two metal structures includes a second metal structure and a third metal structure, the second metal structure is coupled to a signal conductor and the third metal structure is coupled to a power supply conductor.

33. The IC die of claim 19, wherein the at least two metal structures includes a second metal structure and a third metal structure, the second metal structure is coupled to a first signal conductor and the third metal structure is coupled to a second signal conductor.

* * * * *